US009141748B2

(12) United States Patent
Huynh et al.

(10) Patent No.: US 9,141,748 B2
(45) Date of Patent: Sep. 22, 2015

(54) METHOD AND SYSTEM FOR THE MODULAR DESIGN AND LAYOUT OF INTEGRATED CIRCUITS

(75) Inventors: Steven Huynh, Sunnyvale, CA (US); David Kunst, Cupertino, CA (US)

(73) Assignee: Active-Semi, Inc. (VG)

( * ) Notice: Subject to any disclaimer, the term of this patent is extended or adjusted under 35 U.S.C. 154(b) by 988 days.

(21) Appl. No.: 12/583,552

(22) Filed: Aug. 21, 2009

(65) Prior Publication Data

US 2009/0315165 A1 Dec. 24, 2009

Related U.S. Application Data

(63) Continuation of application No. 11/544,876, filed on Oct. 7, 2006, now Pat. No. 7,581,198.

(51) Int. Cl.
*G06F 17/50* (2006.01)

(52) U.S. Cl.
CPC ... *G06F 17/5072* (2013.01); *H01L 2224/49171* (2013.01); *H01L 2924/0002* (2013.01)

(58) Field of Classification Search
CPC .............. G06F 17/5072; H01L 2224/49171; H01L 2924/0002
USPC ......... 716/118, 119, 120, 122, 126, 129, 130, 716/137
See application file for complete search history.

(56) References Cited

U.S. PATENT DOCUMENTS

| | | | |
|---|---|---|---|
| 5,880,598 A | 3/1999 | Duong | 326/41 |
| 7,032,190 B2 | 4/2006 | Auracher et al. | 716/1 |
| 7,392,498 B1 | 6/2008 | Srinivasan et al. | 716/16 |
| 7,516,027 B2 * | 4/2009 | Sutardja | 702/65 |
| 2003/0089927 A1 * | 5/2003 | Ulrey | 257/208 |
| 2004/0221451 A1 * | 11/2004 | Chia et al. | 29/854 |
| 2005/0263888 A1 * | 12/2005 | Jiang et al. | 257/738 |

OTHER PUBLICATIONS

"PSoC® Mixed-Signal Arrays: Higher Integration, Faster Time-To-Market, Greater Embedded Design Flexibility," Cypress Semiconductor Corporation, available from www.cypress.com as "2008_psoc_r_mixed_signal_array_brochure_14.pdf" date unknown, copyright date 2008.

* cited by examiner

*Primary Examiner* — Vuthe Siek
(74) *Attorney, Agent, or Firm* — Imperium Patent Works

(57) ABSTRACT

An integrated circuit (IC) and fabrication method thereof is provided that include the steps of specifying a plurality of required tile modules suitable for a particular end application, each of the modular tiles being configured to perform a pre-determined function and constructed to have approximately the same length and width dimensions. The modular tiles are used to form the IC in a standard IC fabrication process. In many implementations, physical layout of the IC does not include the step of routing. Capabilities also include configuring the modular tiles to have programmable performance parameters and configuring the modular tiles to cooperate usefully with one another based on a programmable parameter.

10 Claims, 10 Drawing Sheets

(b) Pulse Width Modulated (PWM) current-regulated output.

(a) Current-regulated output.

(a) Ratiometric tracking (b) Coincident tracking (b) Single-phase output current (a) Multi-phase output

METHOD AND SYSTEM FOR THE MODULAR DESIGN AND LAYOUT OF INTEGRATED CIRCUITS

CROSS REFERENCE TO RELATED APPLICATION

This application is a continuation of, and claims priority under 35 U.S.C. §120 from, nonprovisional U.S. patent application Ser. No. 11/544,876, entitled "Method and System for the Modular Design and Layout of Integrated Circuits," filed on Oct. 7, 2006, now U.S. Pat. No. 7,581,198 the subject matter of which is incorporated herein by reference.

TECHNICAL FIELD

The present invention relates to the design and layout of integrated circuits (ICs). More specifically, the invention relates to a modular partition approach used to create extremely versatile high performance, application specific ICs in the shortest possible time frame.

BACKGROUND INFORMATION

An example of a traditional IC comprised of a core circuit and input/output (I/O) terminals is illustrated by way of example in FIG. 1. The core circuit is typically comprised of several functional blocks. For example, in a multi-output power management integrated circuit (PMIC), the core circuit consists of several linear regulators, various switch-mode DC-DC converters, system control and sequencing circuits, supervisory circuits, etc. Typically, each of the functional blocks in the core circuit has terminals that are routed to the bond pads, located around the perimeter of the IC, which are connected to package pins through wire bonds, as shown by way of example in FIG. 2. Alternatively, Chip-Scale Packaging (CSP) may be used, where a top metal Redistribution Layer (RDL) is used to reposition the I/O terminal locations, and solder bumps or balls are placed on the redistributed I/O pads such that the IC can be flipped over and mounted on a chip carrier laminate substrate. This packaging process is commonly referred to as "flip-chip" technology.

In particular, FIG. 1 shows an example of a traditional integrated circuit comprised of a core circuit 101 and I/O terminals 105. FIG. 2 shows the integrated circuit with bond wires 205 connecting bond pads 120 of the integrated circuit to package leads 210, which are soldered to a conventional printed circuit board (not shown) according to known techniques. Core circuit 101 is typically comprised of several functional blocks 115. For example, without limitation, in a multi-output PMIC, the core circuit may comprise several linear regulators, various switch-mode DC-DC converters, system control and sequencing circuits, supervisory circuits, etc. Typically, each functional block 115 in core circuit 101 has terminals that are routed to bond pads 120 located around the perimeter of the integrated circuit, which are connected to package pins 210 through wire bonds 205, as shown by way of example in FIG. 2. This assembly suffers from parasitics associated with the internal routing from functional blocks 115 in core circuit 101 to I/O terminals 105 and from I/O terminals 105 to the PCB through wire bonds 205 and package leads 210.

Unfortunately, the prior art suffers from parasitic resistance, capacitance and inductance (parasitics) associated with the internal integrated circuit interconnections from the functional blocks in the core to the I/O pads, and from the parasitics related to the wire bonds and package pins, in the case of traditional wire bond type packages. Furthermore, the assembly of the integrated circuit in a package with wire bonds and pins unnecessarily wastes space, which is critical in certain space limited applications. In the case of flip-chip CSP, the prior art also suffers from redistribution layer (RDL) routing parasitics.

Furthermore, prior art approaches lack the ability easily to be reconfigured or rearranged to create new products or derivative products. For example, adding new functional blocks would require a complete re-layout of the integrated circuit in order to fit in the additional circuitry. Conversely, removing functional blocks is achieved either by keeping the circuitry on the integrated circuit and by disabling it or deleting the circuitry. In the former case, the die size and cost is not optimal, while in the latter case, the integrated circuit re-layout time requires additional research and development time and resources, which are very expensive. In both cases, adding or subtracting circuitry to modify existing products or to create new ones, adds risk and cost.

In view of the foregoing, there is a need for an improved method for developing highly integrated PMICs that reduces unwanted IC-to-PCB (printed circuit board) parasitics, lowers development risk, and allows much shorter integrated-circuit and system-development times compared to previous solutions.

SUMMARY

To achieve the forgoing and other objects and in accordance with the purpose of the invention, a variety of techniques for the modular design and layout of integrated circuits are described.

A method of constructing integrated circuits (IC) is provided that includes the steps of specifying a plurality of required tile modules suitable for a particular end application, each of the modular tiles being configured to perform a predetermined function and further constructed to have approximately the same length and width dimensions. The tile modules are used to specify and form the IC in a standard IC fabrication process, which may also include the step of embedding I/O terminals and/or bond pads into an upper layer of the modular tiles. In the preferred embodiment, the physical functional circuit layout of the IC does not include the step of routing.

In alternate embodiments, any combination of the followings steps may be further included: configuring at least one of the modular tiles to have at least one programmable performance parameter, the programmability being functional at least after forming the IC; configuring a plurality of the modular tiles to cooperate usefully with one another based on a programmable parameter, the programmability being functional at least after forming the IC and operable to reconfigure the cooperating modular tile plurality to a desired cooperating configuration.

Steps for implementing any of the foregoing functions are also provided. In yet other embodiments, an IC is provided that includes an IC die formed to include a plurality of modular tiles in its active layer, each of the modular tiles being configured to perform a predetermined function and further configured to have approximately the same length and width dimensions, and exposed input/output (I/O) terminals embedded in the active layer, the I/O terminals being in electrical communication with corresponding circuit elements of the modular tile plurality and operable to join with solder balls or bumps used in mounting and functionally connecting the IC with a printed circuit board (PCB). Some embodiments are configured such that each of the modular tiles is configured with a standardized set of connectors that communicatively interconnect the modular tiles, wherein at least portions of the standardized inter-connectors comprised by each modular tile are disposed at approximately fixed locations in or on the modular tile to thereby facilitate the alignment and interconnection between corresponding standardized inter-connectors of adjacent modular tiles. Other embodiments further include interfacing circuitry configured into at least one of the tiles, the interface circuitry being operable to properly interface the at least one interface configured tile to the standardized inter-connectors. Yet other embodiments are configured such that at least one of the modular tiles further comprises a memory storage device that, for example, can be volatile or non-volatile memory that controls functions or characteristics of its associated tile.

In alternate embodiments of the present invention, any combination of the following components/features may be further included: a top metal redistribution layer (RDL) configured to re-route the I/O terminals to different locations within a given modular tile or to one or more other modular tile(s), to thereby enable a plurality of alternative IC package pinouts based on the IC die or to accommodate conventional IC package types; a wafer-level, chip scale package (CSP) that is configured to suitably package the IC die to be thereby operable for direct functional joining to the PCB, wherein the IC device does not include an I/O redistribution routing or an intermediate chip carrier; at least one modular tile functioning as a linear regulator, a switch-mode DC-DC converter, a charge pump, a battery charger, a monitoring circuit, a measurement circuit, a supervisory function, or a control and sequencing circuit; at least one of the modular tiles is configured to have at least one programmable performance parameter, feature, and/or function; at least one of the modular tiles is a power supply regulator, and the at least one performance parameter is an input/output current/voltage electrical characteristic, a start-up profile characteristic, a steady-state operation characteristic, a dynamic transient response characteristic, a fault condition handling characteristic, or a shutdown characteristics of the regulator; an inter-tile master controller unit operable for selectively interconnecting inputs and/or outputs of the modular tiles to cooperate usefully with one another based on a programmable parameter, the programmability being operable to reconfigure the cooperating modular tile plurality into a desired cooperating configuration; wherein the IC device includes modular tiles having a plurality of output signals, and wherein the master controller unit is configured to control the power-up characteristic (e.g., turn-on time, ramp-up rate, or the tracking of one output to another) and/or shutdown characteristic of at least some of the cooperating modular tile plurality; wherein the master controller is configured to further individually control at least one start-up characteristic (e.g., start-up sequence order and timing, or ramp rate and tracking details) of at least some of the cooperating modular tile plurality.

In yet other embodiments of the present invention, at least one of said exposed terminals is embedded in or with the modular tiles or a similar geometric construct, and in some embodiments none of the exposed terminals are embedded in said modular tiles or a similar geometric construct.

Other features, advantages, and object of the present invention will become more apparent and be more readily understood from the following detailed description, which should be read in conjunction with the accompanying drawings. This summary does not purport to define the invention. The invention is defined by the claims.

BRIEF DESCRIPTION OF THE DRAWINGS

The present invention is illustrated by way of example, and not by way of limitation, in the figures of the accompanying drawings and in which like reference numerals refer to similar elements.

FIG. 1 (prior art) shows an example of a traditional IC comprised of a core circuit and I/O terminals.

FIG. 2 (prior art) shows the IC with wire bonds connecting the I/O terminals of the IC to package pins soldered to a printed circuit board (PCB).

FIG. 5A shows a programmable GPIO with a current-regulated output, and FIG. 5B shows a programmable GPIO with a pulse width modulated (PWM) current-regulated output.

FIG. 6A shows ratiometric tracking, and FIG. 6B shows coincident tracking.

Unless otherwise indicated illustrations in the figures are not necessarily drawn to scale.

DETAILED DESCRIPTION

Embodiments of the invention are discussed below with reference to the figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are numerous modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

The present invention will now be described in detail with reference to embodiments thereof as illustrated in the accompanying drawings.

Some embodiments of the present invention may be particularly useful for developing highly integrated PMICs. These embodiments create a modular partition integrated circuit comprised of an array of programmable tiles that define a functional circuit layout with I/O terminals that connect directly to a PCB. Embodiments of the present invention provide a smaller overall solution, reduce unwanted IC-to-PCB parasitics, lower development risk, and allow much shorter IC and system development times compared to conventional solutions.

FIG. 3 illustrates an array of exemplary modular tile constructs for an IC, in accordance with an embodiment of the present invention. The present embodiment utilizes a modular partition approach for constructing ICs, which generally minimizes product development risk, improves new product time-to-market, reduces overall IC and end-system solution size, and generally eliminates unwanted parasitics. In the following description "module" refers to a function block, for example, without limitation, a low drop out (LDO) regulator, a DC-DC converter, a portion of a buck-boost converter, a battery charger, an analog-to-digital converter, a digital-to-analog converter, a micro-controller, a real-time-clock, general purpose input/output circuits, etc., and "tile" refers to a group of one or more modules.

Figure 1:
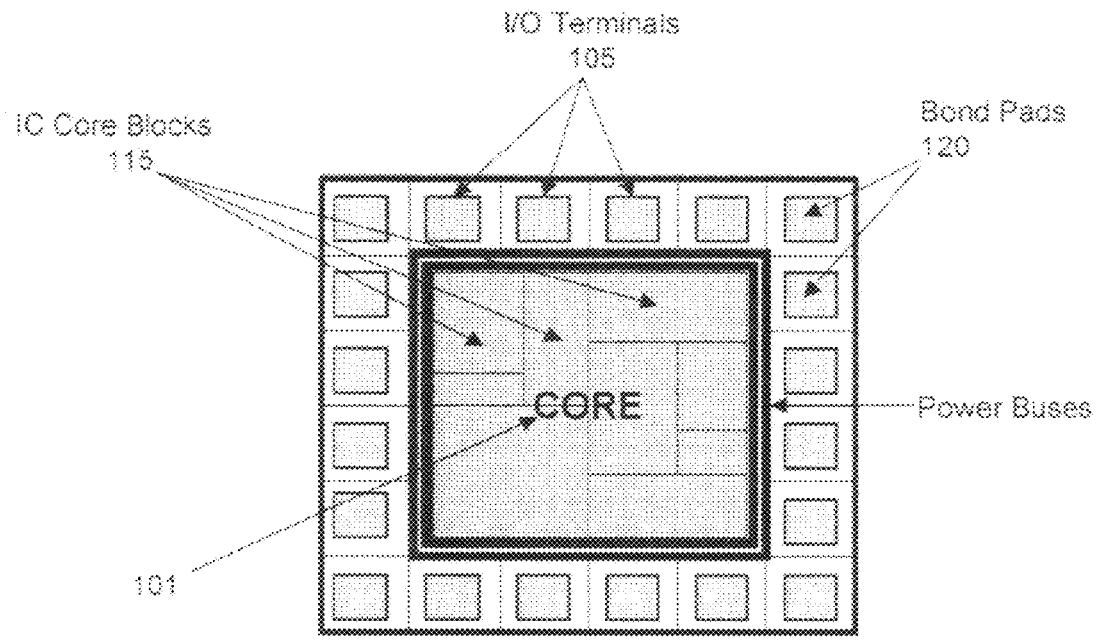
FIG. 1 and FIG. 2 illustrate examples of traditional IC layout.
Figure 2:
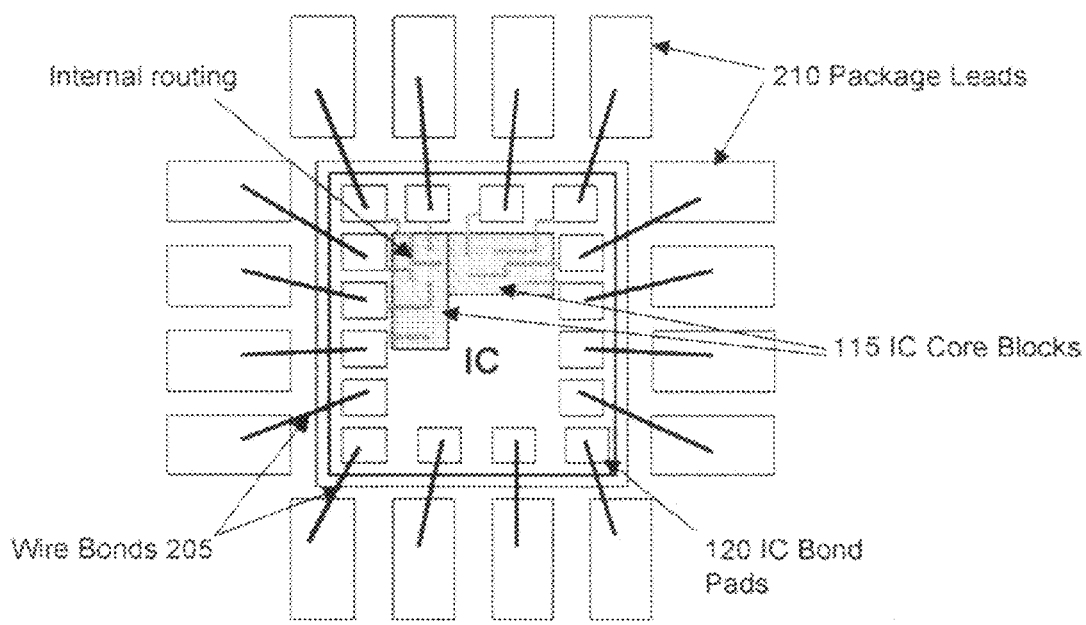
Figure 3A:
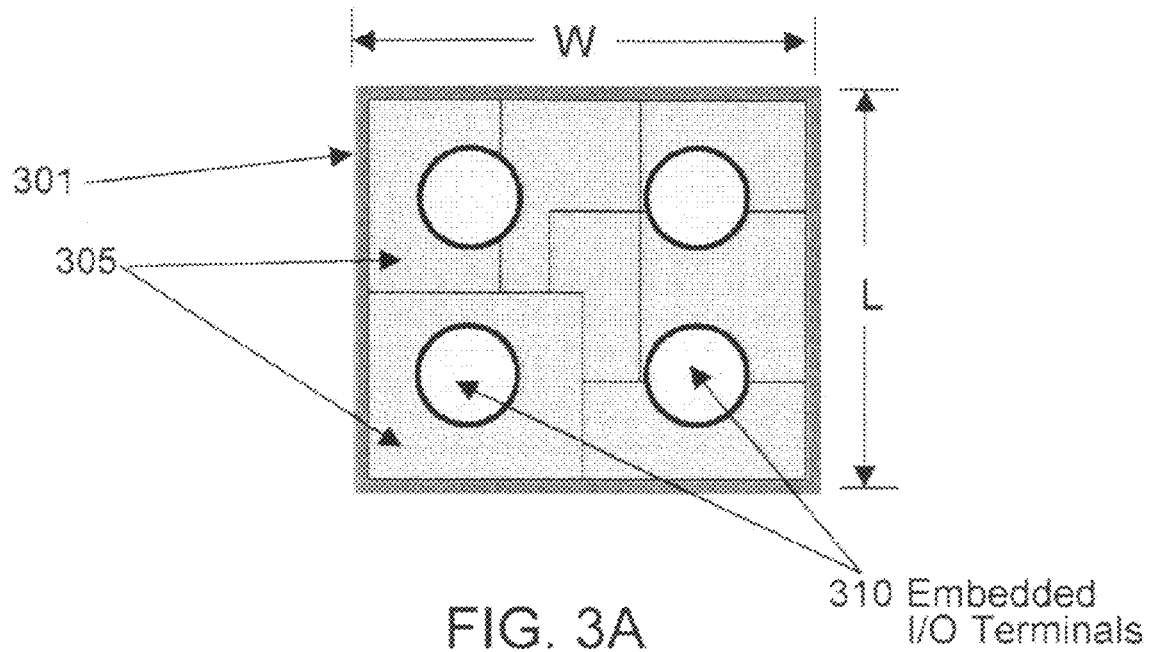
FIG. 3A illustrates a typical layout of an exemplary modular tile construct, which includes functional circuitry and embedded I/O terminals suitably arranged for Chip-Scale Packaging (CSP).
Figure 3B:
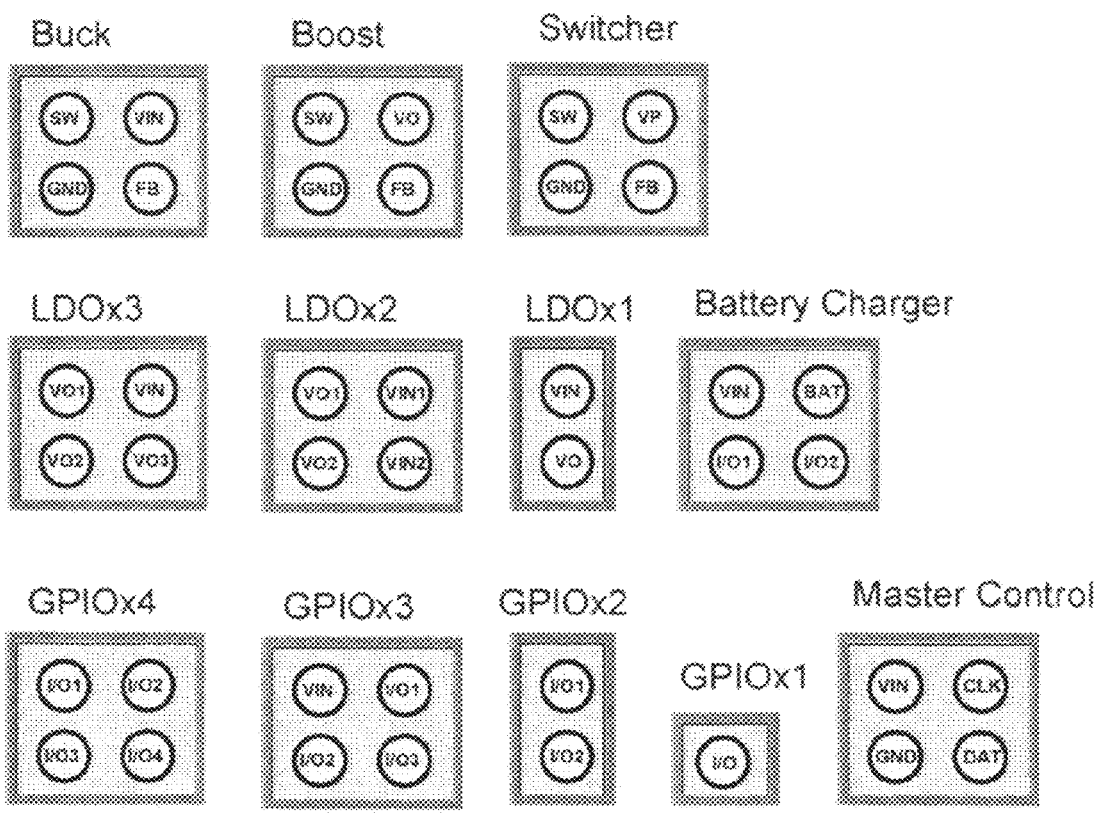
FIG. 3B illustrates several alternate embodiments of some of the core regulator tiles typically required to form a power management integrated circuit PMIC.

FIG. 3A illustrates a typical layout of an exemplary modular tile construct, which includes functional circuitry and embedded I/O terminals suitably arranged for Chip-Scale Packaging (CSP), in accordance with an embodiment of the present invention. FIG. 3B illustrates several alternate embodiments of some of the core regulator tiles typically required to form a PMIC, in accordance with an embodiment of the present invention. The exemplary tiles shown in FIG. 3B include various forms of switching DC-DC converter tiles, LDO tiles, battery charger tiles and GPIO tiles. In FIG. 3A, the tiles 301 comprise both functional circuit blocks 305 and embedded I/O terminals 310. The representative tiles shown in FIG. 3B are just a few examples of tiles that are useful for forming PMICs. Those skilled in the art, in light of the teachings of the present invention, will readily recognize that many other tiles and terminal configurations can be created within the spirit and scope of the present invention to form multiplicity of PMIC products that address the needs of a broad range of end applications. Various tiles similar to tile 301 shown by way of example in FIG. 3 can be constructed and arranged in an array to form a complete PMIC as shown by way of example in FIG. 4.

Figure 4:
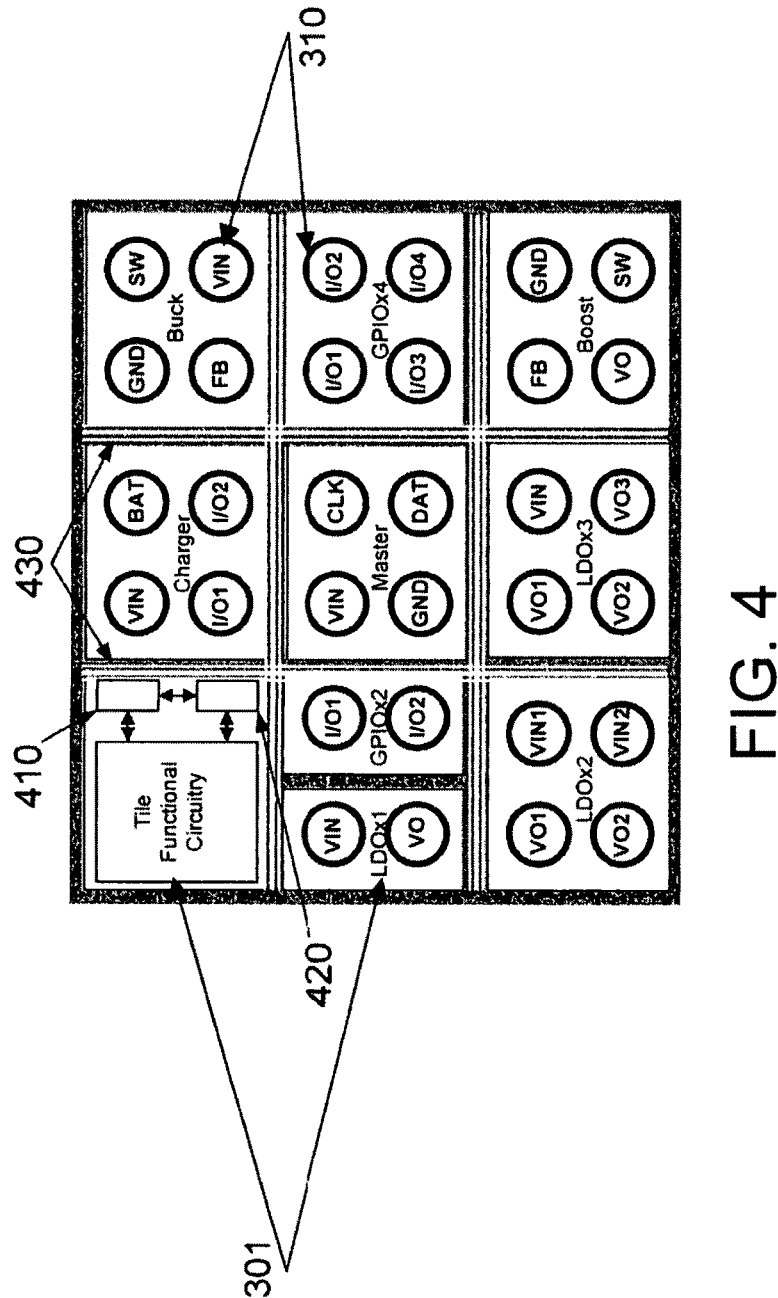
FIG. 4 illustrates an exemplary modular PMIC comprised of fixed-sized tiles with embedded I/O terminals, memory, interface circuitry and a standard signal bus which connects the tiles.

FIG. 4 illustrates an exemplary modular PMIC comprised of fixed-sized tiles 301 with embedded I/O terminals 310, a memory 410, interface circuitry 420, and a standard signal bus 430, which connects the tiles, in accordance with an embodiment of the present invention. In the preferred embodiment of the present invention, standard signal bus 430 is a standardized set of connectors that communicatively interconnect tiles 301 and comprise dedicated signal lines, communication signal lines, control signal lines, and power supply and ground buses, and in which the portion of standard signal bus 430 comprised in each tile 301 is disposed at approximately fixed locations to thereby facilitate the alignment and interconnection between corresponding standard signal buses 430 of adjacent modular tiles.

In one embodiment, the modular tile array-based PMIC is packaged in a wafer-level CSP, which can be attached directly to a PCB without I/O redistribution or intermediate chip carrier. Wafer-level chip-scale packaging allows solder balls or bumps to be placed directly on I/O terminals 310, which are embedded in tiles 301. This method generally eliminates much, if not all, of the unwanted parasitics and wasted area found in the prior art, which results from the large physical separation between the functional circuitry in the IC core and the package pins. In some embodiments, optional redistribution (interconnect) layers may be used to re-route I/O terminals 310 to different locations on tile 301 or across tiles 301 to other locations on the IC to allow for various CSP pinouts with the same die or to accommodate conventional wire-bond or BGA-type packaging, if required by the end user. Other suitable packages include, but are not limited to, SOIC, SSOP, TSSOP, QSOP, MSOP, MLF/QFN, LQFP, MQFP, TQFP, PLCC, MCP, PDIP. As those skilled in the art will appreciate, and as described above, for these leaded packages, the I/O pads need to be redistributed in order to wire bond out to the package leads (see FIGS. 10A and 10B for other exemplary layouts of a modular IC with I/O terminals re-positioned within tiles and/or relocated in other tiles or re-distributed outside of the tiles and placed around the perimeter of the modular IC).

Another aspect of the foregoing modular partition approach is that tiles 301 can be rearranged very easily and quickly to provide a multiplicity of alternative combinations of functions and pinouts depending upon the particular end-system application desired. Given that I/O terminals 310 are embedded into tiles 301, the risk of performance degradation, due to nuisance parasitics and parasitic signal coupling, associated with replacing and rerouting I/O signals from the core to peripheral I/O terminals 310 is significantly reduced to acceptable levels, if not generally eliminated. In the preferred embodiment of the present invention, tiles 301 are of fixed size or approximately fixed size, for example, without limitation, multiples of 0.5 mm on a side (e.g., 0.5×0.5 mm, 0.5×1 mm, 1×1 mm, 1×1.5 mm, 1×2 mm, etc.) with fixed placement of I/O terminals 310 on a 0.5 mm grid, as shown by way of example in FIG. 3. The tiles can be implemented in any suitable rotation or flipped along the vertical or horizontal axis to accommodate all conventional IC layout configurations. In addition, a portion of the tile attributes or design details can be customized when the IC is constructed.

In some practical embodiments of the present invention, the tiles may include standard power supply and control signal buses, which enables the tiles to be automatically placed and connected together, whereby the tiles link-up to form an integrated, scalable power supply grid and control/communication interconnect network, an example of which is illustrated in FIG. 4. It should be appreciated that this is somewhat analogous to power buses on digital standard cells that enable the standard cells to be placed automatically and the power supply buses extend continuously across a row of standard cell logic. Some contemplated control, communication, and power supply signals include, but are not limited to: (a) "committed", fixed-purpose signals such as, without limitation, voltage references and voltage sources, current references and current sources, oscillator signals, clock timing and synchronization signals, data and address signals for programming and communication, analog or digital electrical trimming signals, various ground signals including analog ground, digital ground, and signal ground sense, various power supply signals including analog core power supply, digital core power supply, I/O power supply, and Non-Volatile Memory (NVM) programming power supply, as well as (b) "uncommitted" analog and/or digital signals, which can be claimed by one or more modules for inter-tile connections, control, and/or communication. In some embodiments of the present invention, at least one of the modular tiles is configured to control an electrical and/or performance characteristic at least in part based on information stored in its associated memory 410. In some other embodiments of the present invention, at least one of the modular tiles is configured to generate a voltage reference and/or clock signal(s) that are operable for use by at least of the other modular tiles.

In the preferred embodiment of the present invention, the tiles contain standard interface circuitry 420 as shown by way of example in FIG. 4, which allows the connection and level-shifting of the standard control, communication, and power supply signals. Each tile contains multiplex (mux) and de-multiplex (demux) interface circuitry and encoders and decoders that can be programmed to connect either "committed" or "uncommitted" signals from tile-to-tile. In the preferred embodiment of the present invention, 16 "uncommitted" signal lines are available for each tile to mux-in or mux-out control signals. For example, one tile can mux-out a power good signal to one of the "uncommitted" and unclaimed signal lines and another tile can mux-in this signal to control power up sequencing. Those skilled in the art will recognize many potential uses for the "uncommitted" signal lines and interface muxes within each tile. Level-shift circuits are also included in the tile's interface circuitry to allow mixed power supply operation and ensure proper communication between tiles that use different power supplies. By including in each tile a standard bus of fixed-purpose/fixed-location signals for communication and control, and power supply and ground, along with appropriate interface circuitry for connecting, muxing/de-muxing, and level-shifting these signals, tiles can be relatively easily arranged and readily rearranged to form optimal application specific PMICs depending upon the needs of the particular end application. In the preferred embodiment of the present invention, "plug-and-play" tiles, as described above, with approximately fixed size and standard inter-connect signals and interface circuitry are created to allow rapid development of PMICs. A comprehensive library of modules and tiles, including, without limitation, linear regulators, switch-mode DC-DC converters, charge pumps, battery chargers, monitoring circuits, measurement circuits, supervisory functions, control and sequencing circuits, etc., may be developed and continuously improved such that various application specific PMICs may be produced in a significantly shorter timeframe than what has been accomplished using the traditional full-custom design and layout approach. New PMIC products may be developed from the ground up, from specification-to-silicon, in days instead of months, as is presently achievable with the prior art solution.

In order to develop and produce PMICs quickly according to the present embodiment, tiles 301 are a standard size with standard signals and interface circuitry, as described above, and are programmable to allow reconfiguration for many different end-applications. For example, without limitation, the output voltages and currents of power supply regulator modules are programmable. In the preferred embodiment, other functions such as, but not limited to, the start-up profile, steady-state operation, dynamic transient response, fault condition handling, and shutdown characteristics of the regulator are also programmable to allow performance optimization for various applications.

In the preferred embodiment of the present invention, each tile includes associated memory 410 as shown by way of example in FIG. 4, which can be programmed by an external microprocessor via the PMIC's Master Control Tile. The tile memory of the present embodiment may be realized by any suitable memory technology that best suits the needs of the particular PMIC end application, some common examples of which include, but are not limited to, various forms of either volatile or Non-Volatile Memory (NVM) or a combination of both types. The Master Control Tile of the present embodiment comprises interface logic, which is at least configured to convey the host microprocessor communication and commands to the tiles. Each tile preferably has a certain memory allocation with one or more unique addresses, which are addressable by the host microprocessor via the Master Control Tile interface logic. An aspect of the addressable memory in the tile(s) of the present embodiment is that each bit or byte of memory preferably has a unique address; otherwise it is contemplated that there will be conflicts in many practical applications, which is often a general rule of writing and reading any type of memory in a typical system. When multiple tiles are configured together, the memory of the present embodiment is distributed throughout the IC within the tiles as opposed to the traditional approach of consolidating all of the memory in a central location in the IC. Another aspect of the present distributed tile memory approach is that it enables scalability and flexibility (e.g., adding tiles, removing tiles, and rearranging tiles is relatively easy) without requiring time-consuming custom re-layout of the memory, and memory interface and control logic. In one embodiment of the present invention, described by way of example and not limitation, 32 bits of memory are incorporated in each tile and segmented into four 8-bit configuration bytes, for which the following exemplary description is based upon. The Master Control Tile utilizes a multiplexed address/data communication bus wherein the same 8 signal lines are used for both addressing and data transfer in a two-phase communication sequence. During the first phase of communication between the master tile and target tile, the master places an 8-bit address on the communication bus, which identifies the target tile and selects the memory byte within the tile. In the second phase, the data byte is written to or read from the target tile using the same 8-line communication bus.

By incorporating memory in each tile the aforementioned distributed memory architecture can achieve superior performance in many practical applications whereas conventional methods suffer from the inefficiencies caused by their consolidation of most, if not all, of the PMIC memory within a central location. Thus, the present embodiment provides an extremely versatile and scalable PMIC architecture, which enables tiles to be readily added, subtracted, repositioned, and/or rearranged without disrupting the flow of information and communication from the host microprocessor to the target tile(s). Furthermore, in accordance with another aspect of the present invention, as PMIC functionality is scaled up or down to meet various end-system application requirements, time consuming custom re-layout and reconnection is avoided at least because the memory and memory interface is incorporated in the tiles, and the standard inter-connect bus described above ensures proper connection and signal integrity. In the preferred embodiment, the programmed parameters can be stored in NVM (Non-Volatile Memory), which is contemplated to be various forms including various forms of OTP (One Time Programming) or EPROM, or EEPROM, or FLASH memory.

An aspect of this programmable parameter capability is to effectively simplify the planning and inventory control for both the IC supplier and its customer, at least because one product can satisfy many applications, without significantly compromising product performance or cost. In many applications of the present invention, faster time-to-market is achieved for both the IC supplier and its customers, because the same IC can be reconfigured via software programming to satisfy different end-system requirements. In addition, there are also material cost savings provided by the present invention in many practical applications, at least because the cost to produce extra mask sets to create multiple product options is avoided. Additional efficiencies are enabled by the present capability of programming various parameters, including, without limitation, output voltages and/or currents, dynamic transient response, start-up characteristics, and shutdown behavior. In some embodiments, a mixture of non-volatile and volatile memory is included in some or all of the tiles to enable fixed functionality and/or dynamic programming "on-the-fly" operation.

A particularly useful example of the application of programmable functionality is General Purpose I/O (GPIO) circuits, which provide supervisory and control functions. GPIOs include, without limitation, digital inputs and outputs, as well as analog inputs and outputs. Digital input/output functions include, but are not limited to, standard logic functions and drivers, which are well known to those skilled in the art. Analog inputs include, but are not limited to, voltage, current, time, frequency, temperature, pressure, etc. Analog GPIO input signal processing functions include, but are not limited to, buffering, amplifying, or attenuating single-ended or differential analog inputs, which can then be compared, measured, converted, or used for control. Analog output functions include, but are not limited to, voltage, current, time, and frequency references and sources. For example, without limitation, a GPIO may be programmed to provide an output current source to drive white LED backlights with programmable PWM dimming, as depicted by way of example in FIGS. 5A and 5B.

Figure 5B:
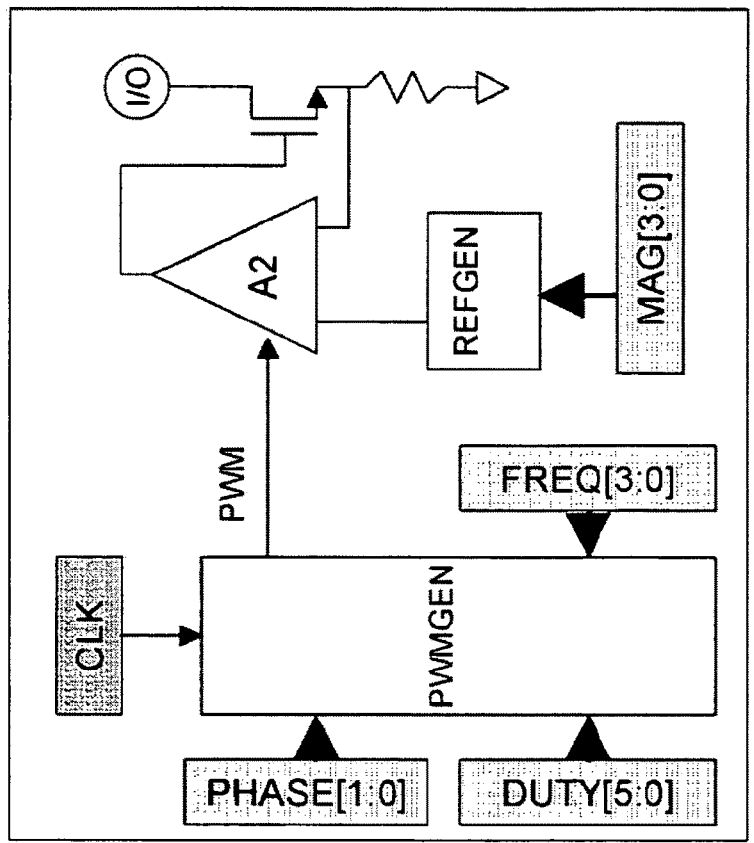
FIGS. 5A and 5B show exemplary programmable General Purpose I/Os (GPIOs) that drive white LED backlights with programmable brightness and dimming control.
Figure 5A:
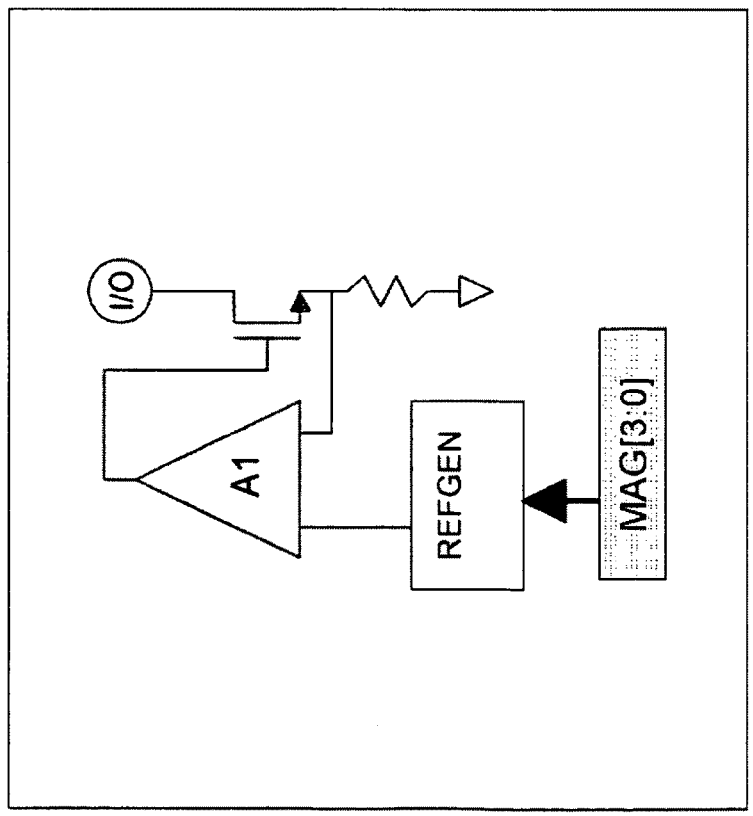

FIGS. 5A and 5B show exemplary programmable GPIOs that drive white LED backlights with programmable brightness and dimming control, in accordance with embodiments of the present invention. FIG. 5A shows a programmable GPIO with a current-regulated output, and FIG. 5B shows a programmable GPIO with a PWM current-regulated output. In the embodiment shown in FIG. 5A, an amplifier A1 is supplied with a programmable reference REFGEN that is used to regulate the output current. In the embodiment shown in FIG. 5B, output current is regulated by an amplifier A2 and switched on and off by a pulse width modulator PWMGEN that provides a programmable PWM frequency and duty cycle. Those skilled in the art, in light of the present teachings, will readily recognize how to adapt almost any analog/digital functional block to be a standard programmable module according to the teachings of the present invention.

Figure 6A:
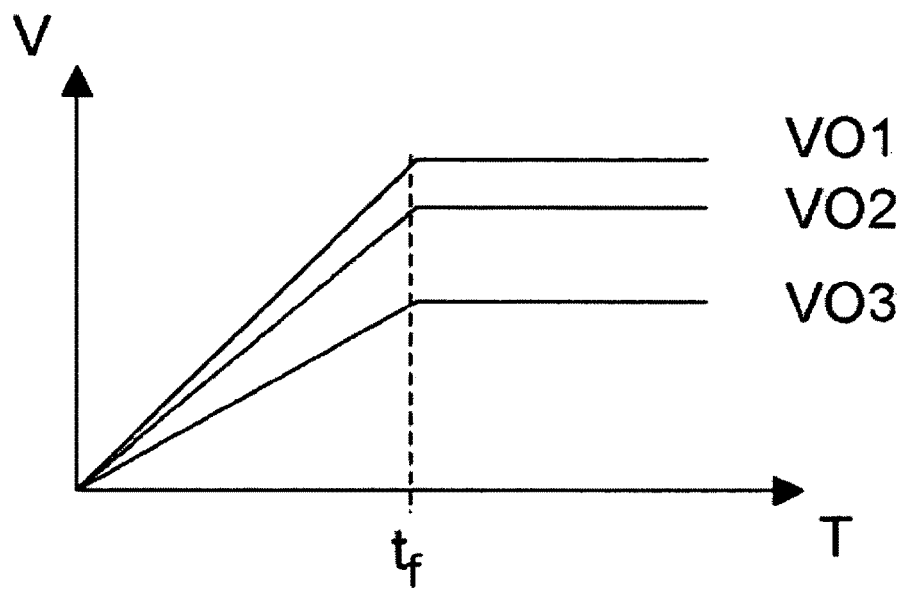
FIGS. 6A and 6B illustrate two examples of power-up tracking, coincident and ratiometric.
Figure 6B:
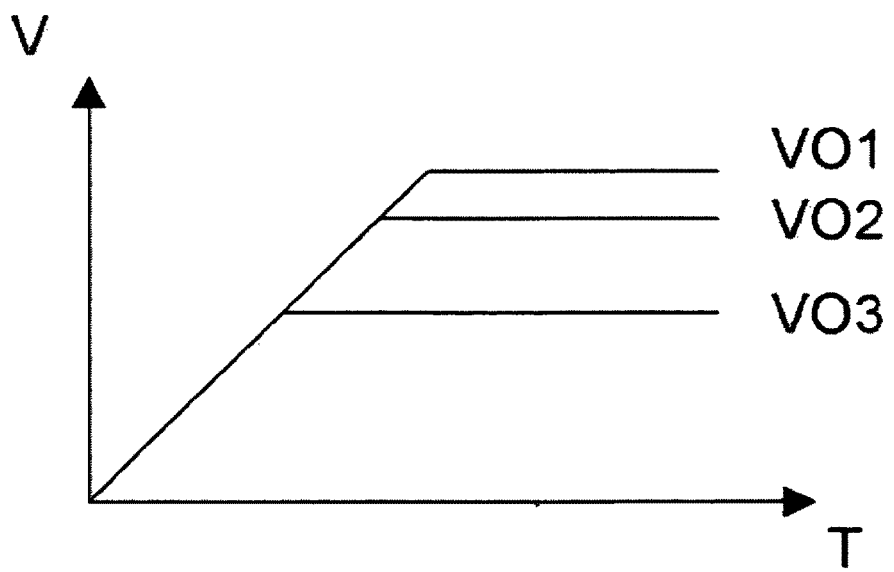

By way of further example, FIGS. 6A and 6B illustrate two examples of programmable power-up tracking, coincident and ratiometric, in accordance with embodiments of the present invention. FIG. 6A shows ratiometric tracking, and FIG. 6B shows coincident tracking. In ratiometric tracking, all outputs finish, or settle to their final regulated output value, at the same time, $t_F$, however, the output voltages rise at different rates. In coincident tracking, all of the outputs rise at the same rate, but they finish at different times. For embodiments comprising multi-output PMICs, a master controller module or tile may manage power-up sequencing and shutdown control of all modules and tiles. For power-up, the master controller may be programmed to control functions such as, but not limited to, the turn-on time, ramp-up rate, and whether or not a particular output should track another output as it powers up. The master controller may control start-up for example, without limitation, by utilizing a start-up sequence list, which is programmed with the sequence order and timing, as well as ramp rates and tracking details, for each PMIC output. This scheme makes use of the fact that each power supply module and tile has a unique address and is programmable. The aforementioned start-up sequencing scheme introduces the idea of modules and tiles communicating with a master controller as well as other modules and tiles.

Another aspect of the preferred embodiment of the present invention is ease of scalability. Scalability can be classified into at least two categories: expanding the capabilities of the PMIC by adding functions, features, inputs, and outputs, and extending the range or drive strength of the PMIC outputs by paralleling modules. In the former case, the fixed size and programmability of tiles according to the preferred embodiment of the present invention enables relatively easy "drop-in", add-on functions. In the latter case, module outputs could be connected in parallel to provide increased power supply output capability. An approach known to those skilled in the art to increase output power capability of a DC-DC converter is to combine outputs by summing each switching stage or phase through their respective inductors as shown by way of example in FIG. 7A. This technique will be recognized by those skilled in the art as multi-phase or poly-phase DC-DC converters. Regulator outputs could also be summed in single-phase switching regulators, as shown by way of example in FIG. 7B, or in a linear regulator to extend the output power range. In both linear and switching regulators the module's power supply controllers could easily be programmed and configured for parallel or multi-phase operation. Likewise, module outputs could be cascaded or connected in series, where one module output becomes the input supply to another module, as shown by way of example in FIG. 8. Depending upon the needs of the particular application, those skilled in the art will readily recognize a multiplicity of alternative and suitable dynamically configurable architectures that can be realized without having to rework the layout of the IC or perform design validation, circuit simulations, or physical design verification.

Figure 7B:
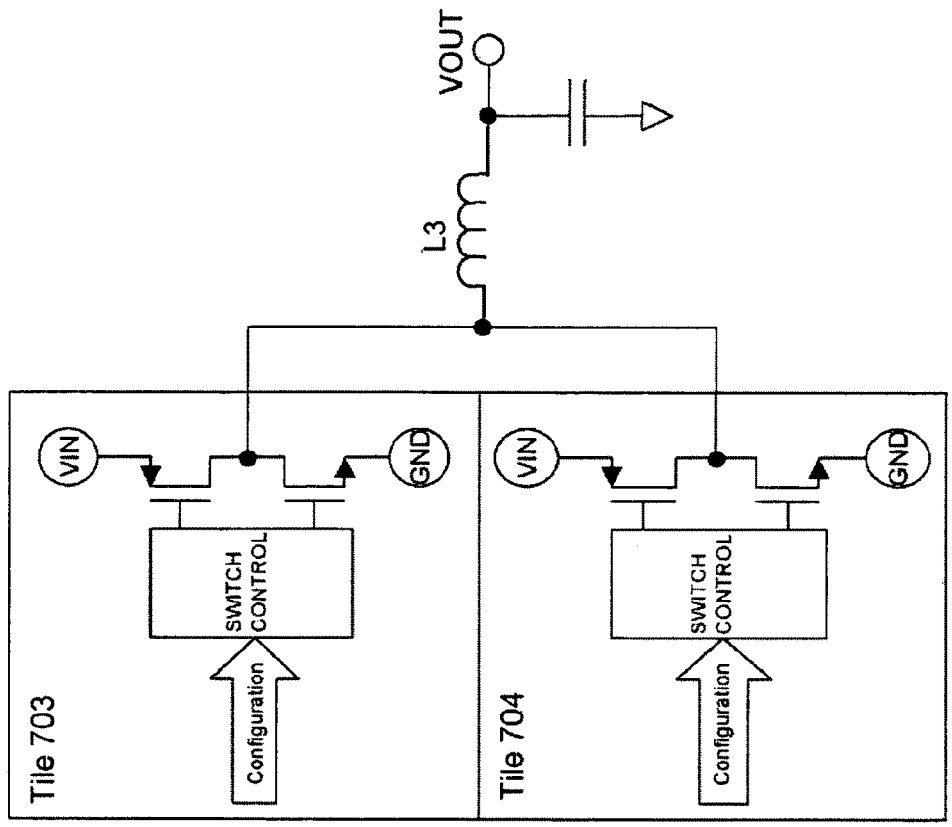
FIGS. 7A and 7B show exemplary parallel regulator tile arrangements to extend output drive and increase output power, in accordance with embodiments of the present invention.
Figure 7A:
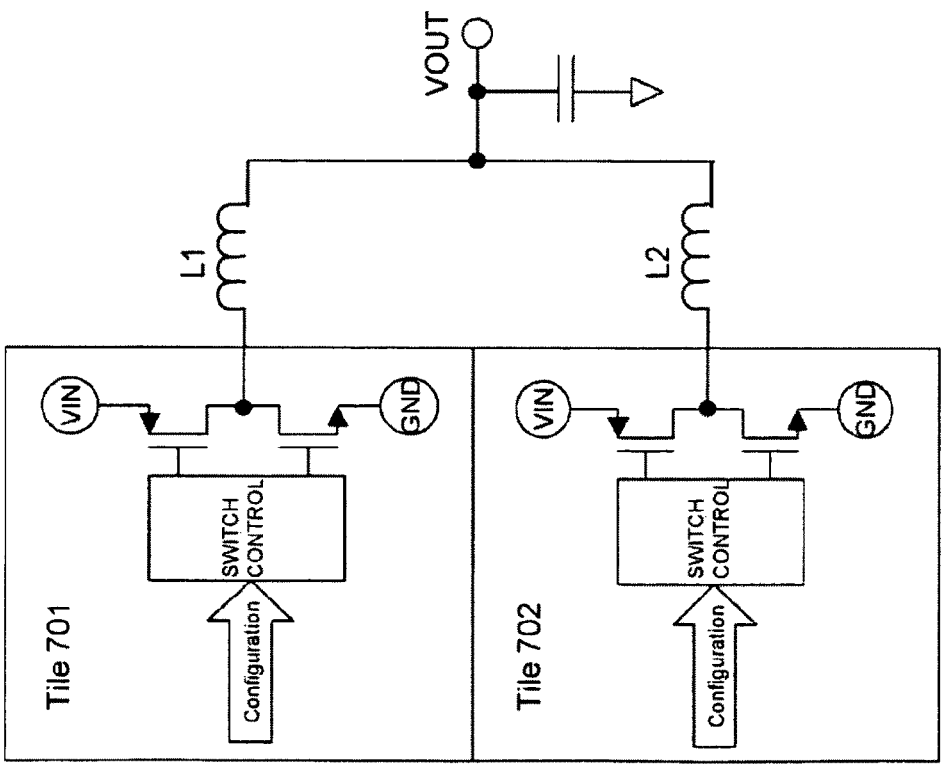

FIGS. 7A and 7B show exemplary parallel regulator tile arrangements to extend output drive and increase output power, in accordance with embodiments of the present invention. The arrangement shown in FIG. 7A has a multi-phase output comprised of two buck tiles 701 and 702 configured and arranged to provide two times the output current. In the present embodiment, tile 701 and tile 702 are programmed to share output current and to run out-of-phase through inductors L1 and L2 to reduce input ripple and input bypass capacitance. The arrangement shown in FIG. 7B comprises single-phase buck stages to provide two times the output current. In this embodiment a tile 703 and a tile 704 are programmed to switch in-phase with a single inductor L3. In the preferred embodiment of FIGS. 7A and 7B, the buck tiles are configured and controlled by a master tile (not shown), and the tiles can communicate with the master and/or each other, thereby enabling a significantly higher level of performance.

Figure 8B:
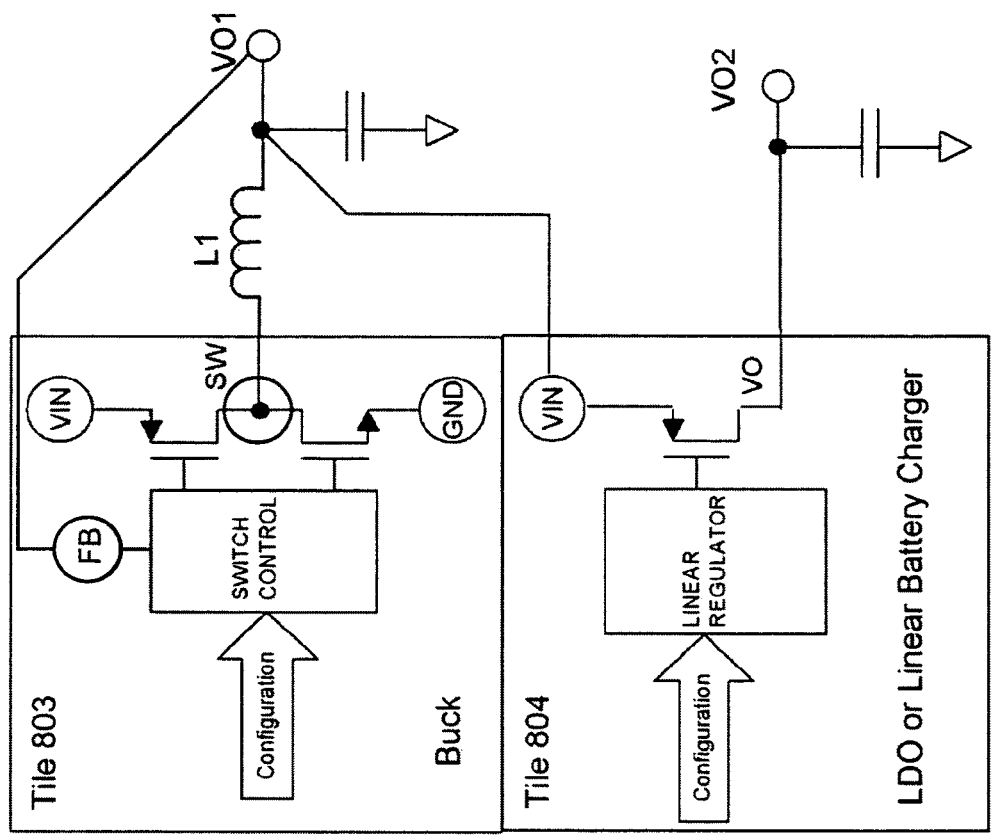
FIGS. 8A, 8B and 8C illustrate exemplary two-tile connection arrangements, in accordance with an embodiment of the present invention.
Figure 8A:
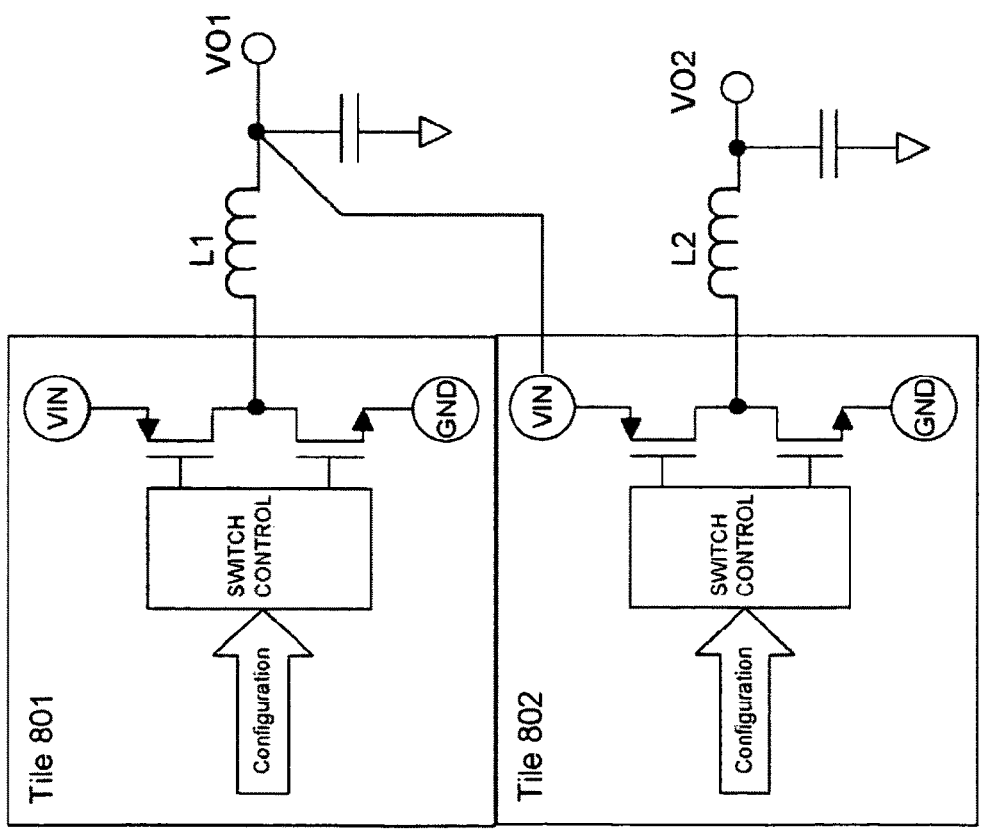
Figure 8C:
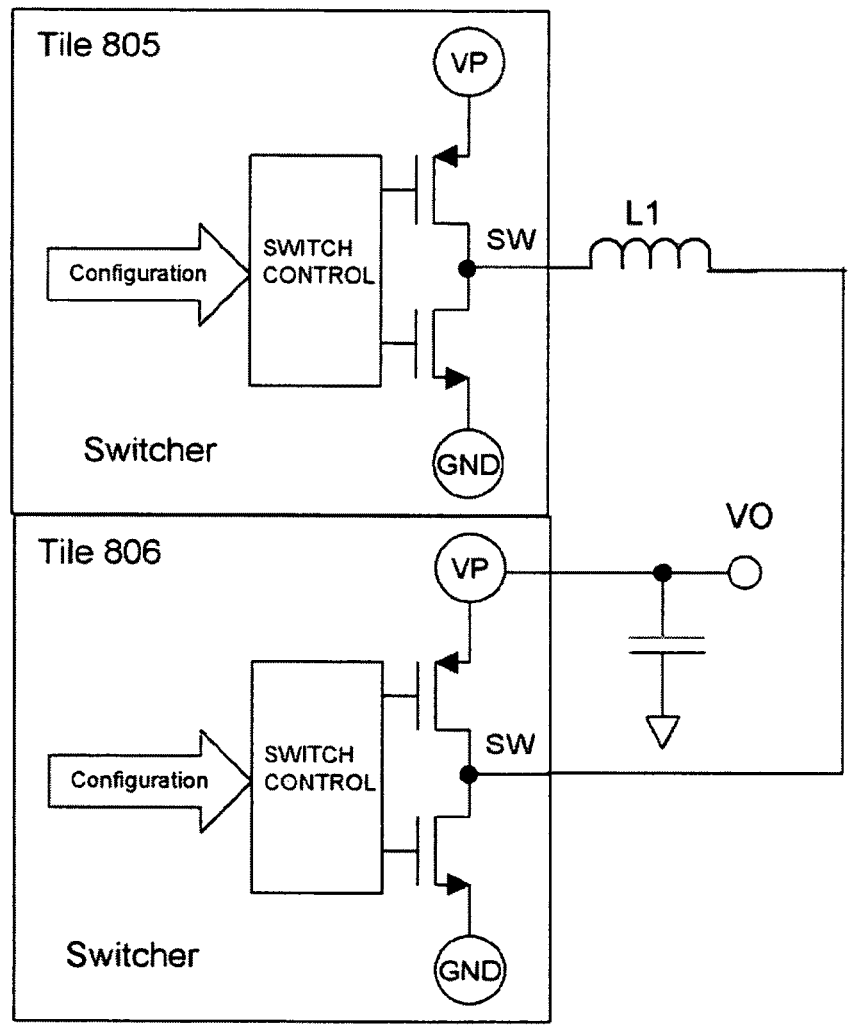

FIG. 8 illustrates exemplary tile-to-tile connection arrangements, in accordance with an embodiment of the present invention. In the present embodiment, the output of a regulator tile 801 feeds the input of a regulator tile 802. In the example of FIG. 8A, both tiles are buck switching regulators, while in FIG. 8B a buck switching regulator tile, 803, output supplies the input of a LDO or linear regulator tile 804 and in FIG. 8C two general-purpose switching regulator tiles 805 and 806 are connected to form a buck-boost power supply. Various tile-to-tile arrangements can be readily implemented to provide efficient power management circuits. In the example shown in FIG. 8B, the output of a switching regulator tile can feed the input of a linear battery charger tile to achieve more efficient battery charging in power-limited applications. Examples of common power-limited applications, without limitation, are USB fed battery charger applications, which typically have limited input supply current of 100 mA or 500 mA. The charging current provided by a linear battery charger is equal to the input supply current. However, if the linear charging regulator is fed with a switching regulator whose input is connected to the USB source and whose output voltage is regulated to $V_{BAT}$+100 mV (for example, assuming the total combined dropout voltage of the switching regulator and linear charger is 100 mV), then the charging current is $I_{CHRG}=\eta \cdot V_{IN} \cdot Iin/V_{BAT}$, where $\eta$ is the efficiency. The typical efficiency of commonly available synchronous switching regulators for this type of application is 90%. Therefore, the battery charging current for a 5V, 100 mA USB input and a 3V discharged lithium battery is $I_{CHRG}$=0.9·5V·100 mA/3.1V=145 mA. As the battery voltage approaches the input voltage the benefit of the more efficient switching regulator becomes less advantageous.

Other useful applications of interconnected tiles includes, without limitation, the formation of a buck-boost switching regulator, as shown by way of example in FIG. 8C. As shown, two general-purpose switching tiles could be configured and connected to realize a buck-boost power supply, which regulates an output voltage that can be either greater than or less than the input supply voltage. For example, without limitation, in many lithium battery powered portable electronics applications a regulated 3.3V power supply is required to power the system's I/O circuitry. However, the lithium battery voltage can typically vary from 4.2V when it is fully charged to 3V or less when it is discharged. Therefore, a power conversion circuit is needed that can buck-down and boost-up the output voltage from the input supply. Those skilled in the art will readily recognize that this can be achieved according to the teachings of the present invention by configuring and connecting two general-purpose, programmable switching regulator tiles and controlling their switching operation based on the input battery voltage and sensed output voltage. This flexibility allows the same physical IC to have some of its terminals externally configured into one buck-boost converter or two separate DC-DC converters.

In the preferred embodiment, the combination of standard-sized tiles, programmable functionality and electrical characteristics enables highly integrated, application specific PMICs to be developed quickly. In many practical situations, PMIC development times using an approach according to the preferred embodiment of the present invention can be measured in hours instead of weeks. With a comprehensive tile library comprising production ready, proven designs, PMICs may be put together without the need for traditional design validation for example, without limitation, no circuit simulation or DRC/LVS physical design verification. It should be clear that the foregoing embodiments provide a substantially different approach from the prior art (e.g., analog/digital standard IP libraries, etc.) at least in that tiles of the preferred embodiment are fixed size or approximately fixed size, programmable analog/mixed-signal tiles, and the tile dimensions and ports are optimized to enable the smallest solution size and fastest time-to-market. For example, in one implementation instance of the preferred embodiment, all of the tiles' length and width dimensions are multiples of approximately 0.5 mm with 0.5 mm I/O terminal pitch, as shown in FIG. 4, with a standard power, communication, and control buses, which automatically link up when the tiles are placed together. In this way, it is possible very rapidly and easily to put together a highly integrated Power Management IC, at least because the tile library is already set up with these efficiencies in mind.

Figure 9:
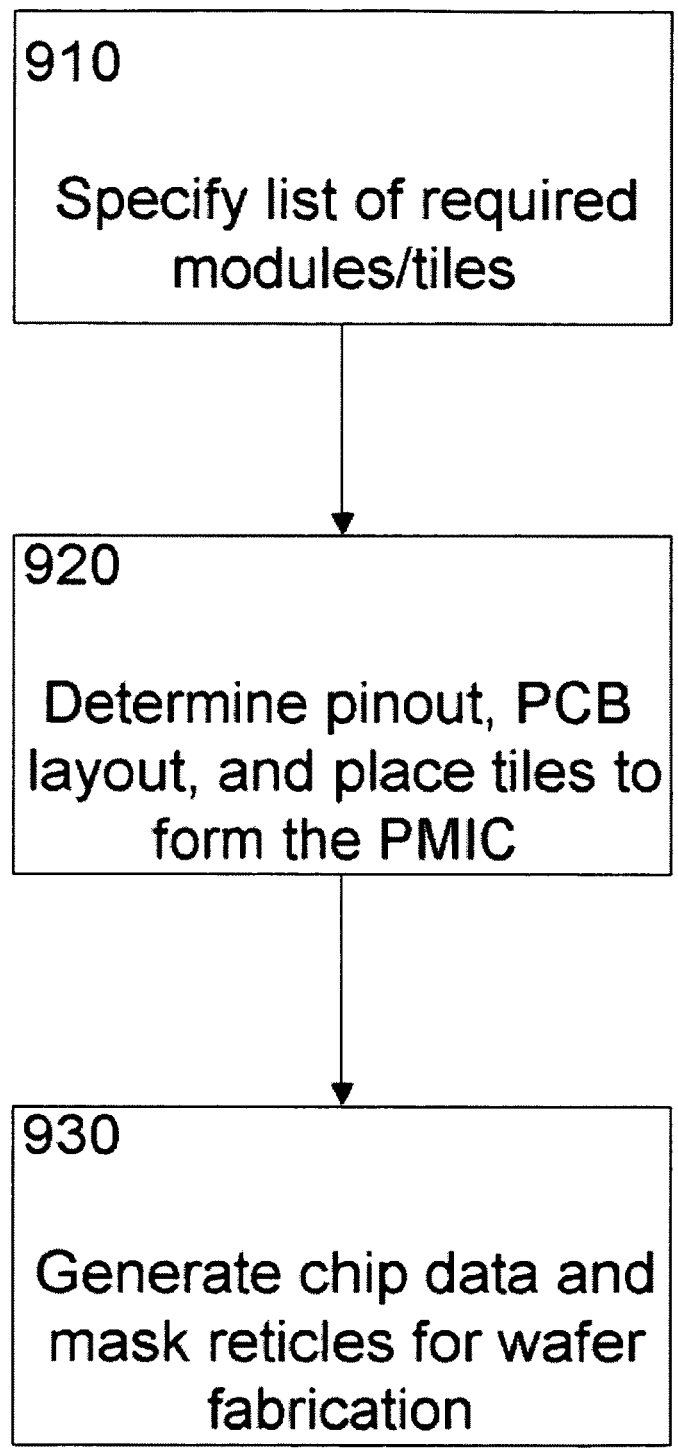
FIG. 9 illustrates an exemplary method for developing a PMIC according to an embodiment of the present invention.

FIG. 9 illustrates an exemplary method for developing a PMIC according to one embodiment of the present invention. In an exemplary sequence, the process includes the following steps: beginning with a step 910 for specifying the list of required modules for the particular end-application, then a step 920 of determining the preferred PMIC pinout and end-application PCB layout, placing the tiles to form the PMIC, and a step 930 of generating the chip data for mask reticles for wafer fabrication. Of course, these steps may be performed in any suitable order and other steps may be introduced at any point, depending upon the needs of the particular implementation. The actual physical layout of the PMIC involves, without limitation, placing tiles, similar to the conventional process of digital cell place and route layout, which is used for logic block design, except in this method there is no need for routing, at least because each tile includes a standard power supply and control signal bus and circuitry which automatically links the tiles together. By reusing proven tiles, the development risk of the PMIC and end-application is substantially reduced, enabling significant time-to-market advantages for both the PMIC supplier and end-system manufacturer. Furthermore, by making the modules highly programmable and reconfigurable, the end-system manufacturer can specify one PMIC that could be used in many end-system models, which further reduces risk and simplifies planning and inventory control.

Figures 10A, 10B:
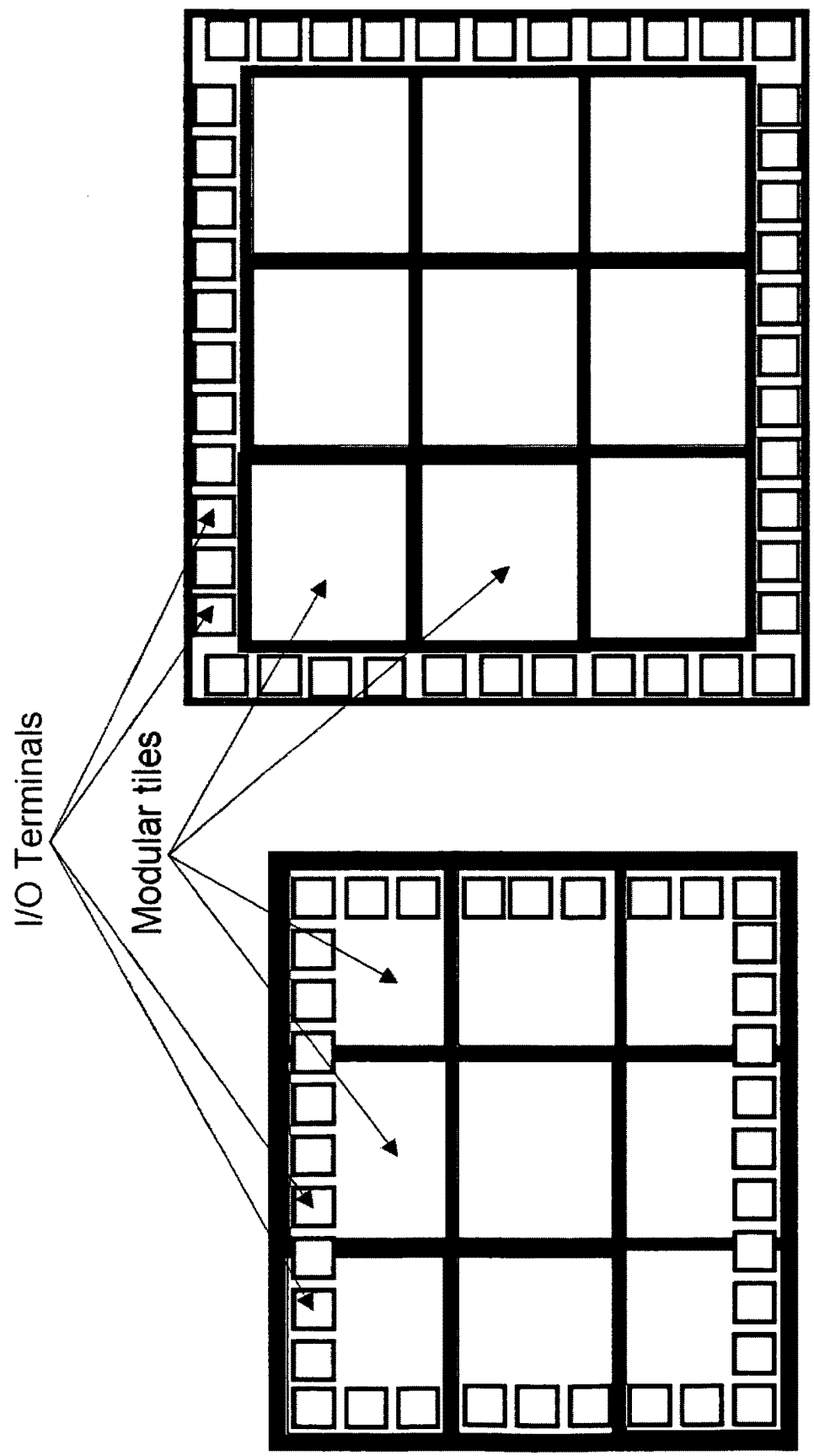
FIGS. 10A and 10B illustrate exemplary modular IC layouts with I/O terminals repositioned within tiles or relocated in other tiles or redistributed outside of the tiles and placed around the perimeter of the IC.

FIGS. 10A and 10B illustrate exemplary modular IC layouts with I/O terminals repositioned within tiles or relocated in other tiles or redistributed outside of the tiles and placed around the perimeter of the IC, in accordance with an embodiment of the present invention. FIG. 10A exemplifies a modular integrated circuit with terminals or I/O pads repositioned within tiles or relocated in other tiles, and FIG. 10B exemplifies a modular integrated circuit where the terminals or I/O pads are configured outside the tiles or located around perimeter of modular IC. Depending upon the needs of the particular application, those skilled in the art, in light of the present invention, will readily recognize a multiplicity of alternative and suitable approaches to locate, configure, and connect terminals or I/O pads including various hybrid combinations of the embodiments shown.

Having fully described at least one embodiment of the present invention, other equivalent or alternative means for implementing a modular partition approach to quickly create versatile, high performance, application specific ICs according to the present invention will be apparent to those skilled in the art. The invention has been described above by way of illustration, and the specific embodiments disclosed are not intended to limit the invention to the particular forms disclosed. The invention is thus to cover all modifications, equivalents, and alternatives falling within the spirit and scope of the following claims.

What is claimed is:

1. An integrated circuit, comprising:
a first modular tile having a square shape, wherein the first modular tile performs a first function;
a second modular tile having a square shape of the same size as the first modular tile, wherein the second modular tile performs a second function, wherein an end application of the integrated circuit is operational when the first function and the second function are performed regardless of which edge of the first modular tile is placed adjacent to any edge of the second modular tile, and wherein each of the first modular tile and the second modular tile has a standardized set of connectors disposed on each of its four edges such that a first set of connectors on an edge of the first modular tile aligns with a second set of connectors on an edge of the second modular tile regardless of which edge of the first modular tile is adjacent to any edge of the second modular tile.

2. The integrated circuit of claim 1, wherein the integrated circuit controls a voltage output by a power regulator.

3. The integrated circuit of claim 1, further comprising:
a third modular tile, wherein the first modular tile communicates with the second modular tile through the first set of connectors, through the third modular tile, and through the second set of connectors.

4. The integrated circuit of claim 1, wherein the end application is performed using a set of electrical signals that is common to both the first modular tile and the second modular tile, wherein the first set of connectors and the second set of connectors form a standard signal bus, and wherein the common set of electrical signals is communicated via the standard signal bus.

5. The integrated circuit of claim 4, wherein the standard signal bus comprises a communication signal line, a control signal line, a power supply bus and a ground bus.

6. The integrated circuit of claim 1, wherein the first modular tile includes a programmable memory, wherein the second modular tile is a master control tile, and wherein an external microprocessor uses the master control tile to program the programmable memory.

7. The integrated circuit of claim 6, wherein the integrated circuit controls a voltage output by a power regulator, wherein the programmable memory controls a programmable performance parameter of the first modular tile, and wherein the programmable performance parameter is taken from the group consisting of: an output voltage of the power regulator, an output current of the power regulator, and an input current of the power regulator.

8. The integrated circuit of claim 1, further comprising:
a third modular tile, wherein each of the first, second and third modular tiles has a programmable memory, and wherein each bit of each programmable memory has a unique address.

9. An integrated circuit, comprising:
a first modular tile having a square shape, wherein the first modular tile performs a first function; and
a second modular tile having a square shape of the same size as the first modular tile, wherein the second modular tile performs a second function, wherein an end application of the integrated circuit is operational when the first function and the second function are performed regardless of which edge of the first modular tile is placed adjacent to any edge of the second modular tile, and wherein the first modular tile comprises a means for transmitting signals to the second modular tile regardless of which edge of the first modular tile is placed adjacent to any edge of the second modular tile.

10. The integrated circuit of claim 9, wherein the signals transmitted by the means are common to both the first modular tile and the second modular tile, and wherein the means forms a standard signal bus through which the common set of electrical signals is communicated.

* * * * *